United States Patent [19]

Novembre et al.

[11] Patent Number: 4,701,342
[45] Date of Patent: Oct. 20, 1987

[54] NEGATIVE RESIST WITH OXYGEN PLASMA RESISTANCE

[75] Inventors: Anthony E. Novembre, Union; Elsa Reichmanis, Westfield, both of N.J.

[73] Assignee: American Telephone and Telegraph Company, AT&T Bell Laboratories, Murray Hill, N.J.

[21] Appl. No.: 837,018

[22] Filed: Mar. 6, 1986

[51] Int. Cl.⁴ .............................................. B05D 3/06
[52] U.S. Cl. ................................... 427/38; 427/43.1; 430/270; 430/296
[58] Field of Search ................ 423/38, 43.1; 430/270, 430/296; 526/279; 522/148

[56] References Cited

U.S. PATENT DOCUMENTS 4,551,417  11/1985  Suzuki et al. ...................... 430/270

OTHER PUBLICATIONS

"Copolymers of Trimethylsilylstyrene with Chloromethylstyrene for a Bi-Layer Resist System", *Journal of the Electrochemical Society*, vol. 130, No. 9, Sep. 1983, pp. 1962–1964, M. Suzuki et al.

Primary Examiner—John H. Newsome
Attorney, Agent, or Firm—Bruce S. Schneider

[57] ABSTRACT

Polymers formed from monomers such as chloromethyl styrene and trimethylsilylmethyl methacrylate form negative-acting resists that are sensitive to exposure by electron beam and deep UV radiation. These materials are particularly useful in bilevel resist applications for fabricating masks or for device processing.

8 Claims, 1 Drawing Figure

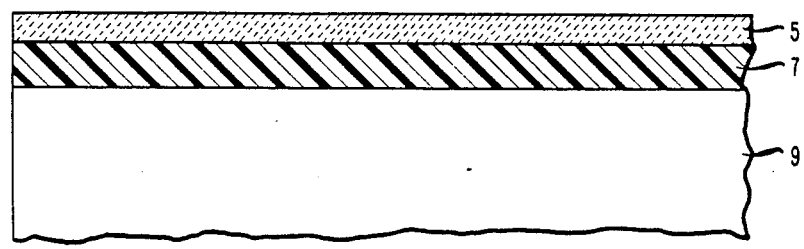

NEGATIVE RESIST WITH OXYGEN PLASMA RESISTANCE

BACKGROUND OF THE INVENTION

1. Field of the Invention

This invention relates to fabrication of electronic devices and, in particular, the fabrication procedures utilizing lithographic techniques.

2. Art Background

Trilevel resists—resists especially suitable for the lithographic definition of small features, i.e., features smaller than 2 μm—have been utilized in the formation of lithographic masks and in the formation of electronic devices. In the former case, the resist is generally delineated with a directed electron beam and an underlying metal layer, e.g., a gold containing layer of an X-ray mask, is then etched to produce the desired mask. In the latter case, the resist is delineated with a directed electron beam, or a previously fabricated mask is employed with exposing radiation, e.g., deep UV, X-ray, or near UV, to delineate the resist.

Trilevel resists include an underlying layer generally deposited directly on the substrate being processed. (The substrate in this context is a mask blank or the semiconductor body including, if present, various levels of, for example, metallization, doped semiconductor material, and/or insulators.) Since the substrate typically, at least for device fabrication, does not have a planar surface, this layer is usually deposited with a thickness that is sufficient, despite the underlying irregularity, to present an essentially planar upper surface. An intermediary layer is then formed on this planarizing layer. The composition of the intermediary layer is chosen so that it is etched at least 5 times slower than the planarizing layer by a plasma that is capable of removing the underlying layer. A third layer (an overlying layer) that is delineable by exposure to radiation and by subsequent treatment with a suitable developing medium is formed on the intermediary layer.

The trilevel resist is patterned by first delineating the overlying layer in the desired pattern. This pattern is then transferred to the intermediary layer through conventional techniques such as dry processing, e.g., reactive ion etching, causing an uncovering, in the desired pattern, of the underlying layer. The uncovered regions, generally of organic materials, are then removed with an oxygen plasma. Intermediary layers of materials such as silicon dioxide, that are essentially unaffected by an oxygen plasma, are employed to avoid its destruction during plasma processing and thus degradation of the transferred pattern.

Although the trilevel resist has proven to be an excellent expedient for producing fine features, it does involve several discrete processing steps. Since there is always a desire to reduce processing steps and the associated costs, there has been a significant effort to develop a bilevel system yielding the advantages, i.e., planarization and high resolution, of a trilevel system. Attempts typically have been made to combine the attributes of the intermediary layer and the overlying layer into a single layer. To effect this combination, the resultant layer should be both delineable and also should be at least 5 times more resistant than the underlying layer to the medium utilized to develop the underlying layer.

Other properties that depend on the particular resist application are also desirable for the overlying layer of a bilevel resist. For example, since masks or custom devices formed at least in part by direct writing are typically fabricated by relatively slow electron beam exposure, the relationship of resist tone to mask geometry is often chosen to minimize the area to be exposed and, in turn, to reduce exposure time. Thus, certain mask geometries, those with a majority of transparent area, are more quickly exposed with a negative-acting resist overlying layer—a layer in which the exposed material remains after development. In contrast, certain mask geometries, those with a majority of opaque areas, are more quickly exposed with a positive-acting resist overlying layer—a layer in which the exposed material is removed after development.

For trilevel processing with relatively rapid exposure techniques, e.g., UV exposure, positive resist materials have typically been utilized, at least in part, because they generally afford higher resolution. For example, a resist material described in commonly assigned U.S. Pat. No. 4,481,049, issued Nov. 6, 1984, which is hereby incorporated by reference, has been disclosed for such uses.

Irrespective of the resist tone and delineation technique, to limit exposure time it is generally desirable that the resist have a relatively high sensitivity. For example, it is typically desirable to have sensitivities that require less than 20 μcoulombs/cm$^2$ preferably less than 10 μcoulombs/cm$^2$ for electron beam exposure and less than 500 millijoules/cm$^2$ for deep UV exposure.

SUMMARY OF THE INVENTION

A material suitable for use in bilevel resists yielding excellent stability, resolution, and sensitivity and having a negative exposure tone to radiation, e.g., electron or deep UV, has been found. In a bilevel configuration, the bilevel resist includes a conventional underlying layer, e.g., a novolac-based resist such as hard-baked HPR-204 (a proprietary product of Philip A. Hunt Chemical Company which is basically a novolac resin with a naphthoquinone diazide sensitizer). The embodiment further includes an overlying layer formed by the polymerization of at least 2 different monomers. These polymers are those produced from monomers including at least one monomer chosen from the group represented by:

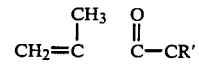

where R' is a silicon-containing moiety such as a silicon alkyl or lower alkoxy represented by the formula:

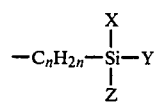

n being 1, 2, or 3 and X, Y, and Z being any combination of ethyl, methyl, or methoxy; and further including at least one monomer chosen from the group represented by:

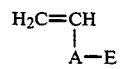

where A is a phenyl or naphthyl moiety, where E is chloro, chloromethyl, dichloromethyl, or bromoethyl, and where E is substituted on the naphthyl or phenyl ring at a position that avoids steric effects that preclude polymerization. Surprisingly, the resists of the invention are negative acting with high sensitivity and stability, even though the homopolymer of monomer I is positive acting. That is, the combination of monomer I and monomer II produces a highly desirable negative-acting resist material, while monomer I alone leads to a positive-acting material.

BRIEF DESCRIPTION OF THE DRAWING

The FIGURE is illustrative of structures involved in the invention.

DETAILED DESCRIPTION

As discussed, in one embodiment a bilevel resist including an underlying layer, 7, and an overlying layer, 5, that is delineable and that is resistant to the medium utilized to develop the underlying layer is typically deposited on a substrate, 9. The material utilized for the underlying layer is not critical and typically includes organic materials such as novolac and polyimide resins, e.g., (1) HPR-204 (a proprietary product of Philip A. Hunt Chemical Company) or AZ-1350 or AZ-1350J (proprietary products of Shipley Co., Inc.,) which are basically novolac resins with a substituted naphthoquinone diazide solution inhibitor baked, for example, at 210 degrees C. for 1 hour and (2) polyimides such as Pyralin (i.e., proprietary material of E. I. duPont deNemours and Co., Inc.).

The underlying layer material, unlike a typical resist, need not undergo a chemical change upon exposure to radiation. It is only necessary that the material of the underlying resist layer be removable with an oxygen plasma and not appreciably dissolve in the solvent utilized to form the overlying layer. (See *VLSI Technology*, Chapter 8, edited by S. M. Sze, McGraw-Hill, New York, 1983, for a complete description of the removal of materials through plasma techniques.) Appreciable dissolution in this context means the intermixing of the overlying layer with the material from more than 500 Angstroms of the underlying layer. The thickness of the underlying layer depends on the size of the surface irregularities in the substrate. For typical structures utilized in the formation of semiconductor devices, layer thicknesses greater than 1 μm yield an essentially planar surface. For the fabrication of masks, thicknesses in the range 0.5 μm to 2.0 μm are usually employed. However, thicknesses greater than 4 μm, although not precluded, are generally uneconomic and require excess processing time.

The thickness of the overlying layer depends on the desired resolution and the oxygen plasma etching resistance of this layer. Generally, the thicker the layer, the poorer the resolution. For resolutions less than 2 μm, layer thicknesses in the range 0.3 μm to 1.0 μm are typically utilized. Suitable layer thicknesses for either the underlying or overlying layers are easily obtained by conventional techniques such as by dissolving the material that is to form the layer in a solvent and spin coating the final layer onto the substrate. (A full description of spin coating is found in *Photoresist Materials and Processes*, W. S. DeForrest, page 223, McGraw-Hill, New York, 1975.) The spinning speed and resist solid concentration utilized in the coating procedure primarily determine the layer thickness and are controlled to yield the desired result.

The material of the overlying layer is negative acting and includes a polymer formed from at least one monomer chosen from Group I represented by:

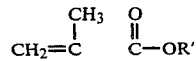

and at least one monomer chosen from Group II represented by:

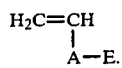

In the Group I monomers, the R' group is chosen to be a silicon-containing moiety such as a silicon alkyl or alkoxy represented by the formula:

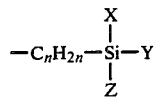

n being 1, 2, or 3 and X, Y, and Z being any combination of ethyl, methyl, or methoxy. In the monomers of Group II, A is chosen to be naphthyl or phenyl; E is chosen to be chloro, chloromethyl, dichloromethyl or bromomethyl; and E is substituted on the phenyl or naphthyl ring in a position which avoids steric effects precluding polymerization. Additionally, further substitution beyond the halogen or dihalogen methyl group on the naphthyl or phenyl ring, such as lower alkyl or halogen substitution where the polymer properties are not adversely affected, is acceptable. The R' substituent and any substituent on the naphthyl or phenyl ring other than the halogen or dihalogen methyl group should be chosen so that silicon constitutes more than 5 weight percent of the final polymer. Typically, for weight percentages lower than 5, adequate oxygen etching resistance is not attained. Addtionally, the substituents should be chosen so that the $T_g$ of the polymer is higher than 25 degrees C., preferably higher than 50 degrees C. A $T_g$ lower than 25 degrees C. is generally obtained if substituents such as propylpentamethyl disiloxane are utilized.

The polymer of the overlying layer should be formed so that moieties corresponding to the Group I monomer constitute 50 to 98 mole percent, preferably 85 to 95 mole percent, of the total polymer moieties resulting from Group I and Group II monomers. Typically, for mole percentages less than 50 percent, insufficient oxygen reactive ion etching (RIE) resistance occurs, while for mole percentages greater than approximately 98 percent, the negative-acting polymer tends to become excessively insensitive to radiation. (For purposes of this disclosure, negative acting occurs when the unirradiated region is essentially completely removed and the irradiated region has at least 30 percent of its original thickness after development.) Generally, however, the lower the percentage of the Group I monomer incorporated into the polymer, the lower the dose required for producing a negative image.

The dispersivity of the copolymer should preferably be 2.5 or less. Dispersivities higher than 2.5 generally produce lower contrasts and unduly degrade the resulting mask or device being fabricated. (Dispersivity is defined in *Polymer Chemistry*, Malcolm P. Stevens, Addison-Wesley, 1973, Chapter 2.) Typically, the molecular weight of the copolymer should also be in the range of 30,000 to 250,000. Molecular weights lower than 30,000 require an excessively high dose for adequate exposure, while molecular weights higher than 250,000 tend to unacceptably degrade resolution.

It is typically desirable to use exposure doses, e.g., doses of deep UV or electron beam radiation, in the range 10 to 500 millijoules/cm$^2$ and 1 to 20 $\mu$coulombs/cm$^2$, preferably 10 $\mu$coulombs/cm$^2$, respectively. (Deep UV light is radiation, for example from a krypton-fluorine excimer laser or Hg-Xe high pressure lamp, having the desired dose intensity in the wavelength range between 220 and 290 nm.) Doses greater than 20 $\mu$coulombs/cm$^2$ (500 millijoules/cm$^2$) or less than 1 $\mu$coulombs/cm$^2$ (10 millijoules/cm$^2$) both lead to lost resolution. Additionally, doses greater than 20 $\mu$coulombs/cm$^2$ (500 millijoules/cm$^2$) require excessive exposure times.

The developing medium should be chosen so that the material remaining after development represents 30 to 95 percent by volume of the material present in those regions before exposure. A wide range of developers are suitable. For example, a 1:1 by volume mixture of toluene in methanol is useful. Generally, solvents which strongly solvate the resist material, i.e., methylethyl ketone, cause swelling and should be avoided. Thus, for example, pure toluene is a strong solvent for the resist and causes disadvantageous swelling. It is desirable that the resist material be baked before exposure to ensure film adhesion and removal of spinning solvent. Typically, this baking is accomplished at a temperature above the $T_g$ of the resist material, e.g., 70 to 100 degrees C., but at a temperature sufficiently low to avoid decomposition. Baking times of 15 to 90 minutes are generally suitable. Baking after development is also desirable to remove developing solvents and to flow the images to the required size. Typically, temperatures in the range of 90 to 180 degrees C. are appropriate. Temperatures less than 90 degrees C. are not desirable because they do not induce pattern flow, and temperatures above 180 degrees C. are not desirable because of resist decomposition.

The polymers utilized in the invention are produced by conventional techniques such as free radical solution polymerization, which is extensively described in a variety of texts such as *Principles of Polymerization*, 2nd Edition, George Odian, John Wiley & Sons, 1981, Chapter 3. Briefly, this procedure involves codissolution of the monomers into a solvent, heating, and addition of an initiator such as benzoyl peroxide.

Pattern transfer from the overlying to the underlying region is typically accomplished by subjecting the substrate to an oxygen plasma. This oxygen plasma technique has been extensively described in *Introduction to Microlithography*, Chapter 6, edited by L. F. Thompson, C. G. Willson, and M. J. Bowden, American Chemical Society, Symposium Series 219, Washington D.C., 1983. Typically, a Hex plasma reactor with bias voltages of −50 to −600 volts yields removal rates for the underlying layer in the range 0.03 $\mu$m/minute to 0.3 $\mu$m/minute. (Under these conditions, the overlying layer is etched at 0.002 $\mu$m/minute to 0.03 $\mu$m/minute.) Generally, the plasma is struck in a gas containing oxygen. Total gas pressures in the range of 1 millitorr to 10 millitorr are generally employed.

After the pattern has been transferred to the umderlying layer, the delineated resist is utilized to form a mask or a device through steps such as metallization, dopant diffusion, or etching. The resist is then removed, and the processing of the mask or substrate is completed.

The following Examples are illustrative of the invention:

EXAMPLE 1

Synthesis of Material

Trimethylsilylmethyl methacrylate and chloromethyl styrene (mixed meta and para isomers) were each individually distilled under vacuum. The distillates were stored at 5 degrees C. until used. A polymerization reaction vessel was prepared by utilizing a 4-neck, 600 ml flask having a glass-Teflon (Teflon is a registered trademark of E. I. duPont deNemours and Company, Inc.) stirrer, a bubbler, a condenser, a septum inlet, and a thermometer. Approximately 125 ml of previously distilled toluene, 3.04 grams of the chloromethyl styrene distillate, and 65.4 grams of the trimethylsilylmethyl methacrylate distillate were added to the reactor. The mixture was then heated to 85 degrees C. utilizing a constant temperature bath, stirring was initiated, and the reactants were maintained in a nitrogen atmosphere. When the reactants reached a steady-state temperature, 0.0145 grams of benzoyl peroxide was added. Additional benzoyl peroxide in the form of a $6.1 \times 10^{-4}$ grams/ml toluene solution was added dropwise at a flow rate of 5.1 ml/hour over a 7-hour reaction period.

After this reaction period, the reaction was terminated by adding the reaction mixture to 200 ml of chilled acetone. This mixture was then added dropwise to a solution of 90 parts by volume methanol and 10 parts by volume water. The resulting precipitate was filtered, redissolved in acetone, and reprecipitated in a 90/10 methanol-water mixture. The precipitate was then separated and dried under vacuum at room temperature for several days. The resulting product had a weight average molecular weight and polydispersivity of $1.87 \times 10^5$ and 2.15, respectively, as determined by high pressure size exclusion chromatography. The polymeric product contained 91 mole percent of moieties corresponding to the trimethylsilylmethyl methacrylate monomer and 9 mole percent of moieties corresponding to the chloromethyl styrene monomer, as determined by proton NMR and elemental analysis for chlorine.

EXAMPLE 2

The procedure of Example 1 was followed except the initial reaction mixture contained 127 ml of toluene, 15.1 grams of chloromethyl styrene, and 51.6 grams of trimethylsilylmethyl methacrylate. The reaction was terminated after 4.7 hours, yielding 15.2 grams of a polymer containing 66.2 mole percent of a moiety corresponding to the trimethylsilylmethyl methacrylate monomer.

EXAMPLE 3

A sufficient amount of the polymer prepared in Example 1 was added to 2-methoxyethyl acetate to yield a 12 percent weight/volume solution. The resulting solution was filtered at least 3 times through a filter stack including a 1 $\mu$m, 0.5 $\mu$m, and 0.2 $\mu$m average pore size Teflon filter. Approximately 3 to 5 ml of the resulting filtered solution were placed on the surface, (100) orientation, of a 4-inch silicon substrate, and the substrate was spun at a speed in the range 2500 to 5000 rpm to yield polymer film thickness in the range 0.65 to 0.45 μm. The resulting coated substrates were then baked in air at 80 degrees C. for 30 minutes.

The substrates were exposed utilizing an electron beam exposure system having a 20 kilovolt acceleration, a 0.25 μm beam address size, and 0.25 μm spot size. The beam was addressed to produce a 20×20 array of test patterns. (Each test pattern had feature sizes ranging from 0.25 to 4 μm.) Each array element was exposed at a different dose, with total doses ranging from 0.5 μcoulomb/cm² to 15 μcoulomb/cm². After exposure, the substrates were spray developed in an APT Model 915 resist processor. The development conditions and the sequence of treatment compositions are shown in the Table.

TABLE

| Sequence | Composition | Time (Sec) | Spray Pressure (PSI) | Spin Speed (rpm) |
|---|---|---|---|---|
| Developer[a] | Toluene/Methanol (1/1) | 30 | 30 | 100 |
| Overlap Rinse | Toluene/Methanol (1/1), Methanol | 10 | 30 | 100 |
| Rinse | Methanol | 45 | 30 | 100 |
| Hot Spin Dry | $N_2$ | 45 | — | 1450 |

[a]Initial developing temperature = 23 degrees C.

The substrates were then baked in air at 80 degrees C. for 30 minutes. Sensitivity, as defined as the dose required to yield a 50 percent thickness of exposed to unexposed region, was 2.0 μcoulomb/cm². Contrast, defined as in *CRC Critical Reviews in Solid State Science*, M. J. Bowden, page 231 (February 1979), was 1.8. (Film thicknesses for these measurements were obtained utilizing a Nanometrics Nanospec/AFT microarea thickness gauge.)

EXAMPLE 4

The surface, (100) crystallographic plane, of a 4-inch silicon substrate was coated with a thickness of 1.55 μm utilizing HPR-206 resist solution (a novolac cresol resin with a quinone diazide sensitizer which is a proprietary product of Philip A. Hunt Chemical Company) by spinning at 2100 rpm. The coated substrates were baked in air at 210 degrees C. for 1 hour. A 0.62 μm film of the polymer synthesized in Example 1 was deposited onto this resist layer by spinning at 2700 rpm. The resulting structure was baked at 80 degrees C. in air for 30 minutes.

The coated substrates were exposed utilizing a 5:1 mask reduction on a GCA 4800 modified wafer stepper with a pulsed KrF laser source (248 nm.) A test pattern was projected utilizing a dose rate at the resist surface of 0.02 millijoules/pulse/cm². The exposed resist was developed as described in Example 3. The patterned substrate was then baked in air at 80 degrees C. for 30 minutes. The sensitivity and contrast were 18 millijoules/cm² and 1.9, respectively. (Thicknesses were measured using DEKTAK Model 11A profilometer.)

EXAMPLE 5

Substrates were coated as described in Example 3. The substrates were placed on the sample holder of an Applied Materials Model 8110 Hex reactor. Oxygen was introduced at a flow rate of approximately 40 sccm to yield a pressure of approximately 4 mtorr. A plasma was struck utilizing a dc bias of approximately −350 volts and maintained for 25 minutes. The resulting etching rate was approximately 35 Angstroms/minute.

EXAMPLE 6

Two silicon substrates were coated with an underlying layer of HPR-206 (1.55 μm thickness) and an overlying layer (0.62 μm thickness) of copolymer as described in Example 4. The substrate was baked at 210 degrees C. for 1 hour in air after the first layer was formed and for 30 minutes at 80 degrees C. in air after the overlying layer was formed. One substrate was exposed to an electron beam dose of 3.2 μcoulomb/cm², and the other substrate was exposed to a dose of 70 millijoules/cm² of 248 nm radiation. The substrates were developed as described in Example 3. The electron beam exposed substrate was baked at 120 degrees C. for 1 hour in air, and the substrate exposed to UV radiation was baked at 80 degrees C. for 30 minutes in air. The resulting pattern in the overlying layer was transferred to the underlying layer utilizing the reactive ion etching conditions of Example 5. Etching was continued for approximately 50 minutes. This procedure resulted in a pattern having dimensions as small as 0.75 μm.

What is claimed is:

1. A process for fabricating an article comprising the steps of forming a negative-acting radiation-sensitive region on a substrate, patterning at least a portion of said region, and further processing said substrate CHARACTERIZED IN THAT said region comprises a composition formed by a polymerization process employing (1) at least one material represented by the formula:

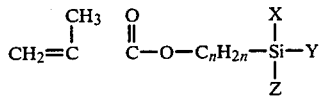

where n=1, 2 or 3 and x, y, and z are individual methyl or ethyl, and (2) at least one material represented by the formula:

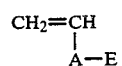

where A is a naphthyl or phenyl moiety, and E is chosen from the group consisting of chloro, chloromethyl, dichloromethyl, and bromomethyl.

2. The process of claim 1 wherein said article comprises a device.

3. The process of claim 1 wherein said article comprises a lithographic mask.

4. The process of claim 1 wherein said composition is formed by a copolymerization process.

5. The process of claim 1 wherein a region capable of selective removal is interposed between said radiation-sensitive region and said substrate.

6. The process of claim 5 wherein said patterning comprises the step of subjecting said region to said radiation and then subjecting said region to a plasma discharge.

7. The process of claim 6 wherein said region capable of selective removal undergoes said removal by being subjected to a solvent.

8. The process of claim 6 wherein said plasma discharge comprises an oxygen plasma discharge.

* * * * *

UNITED STATES PATENT AND TRADEMARK OFFICE
CERTIFICATE OF CORRECTION

PATENT NO. : 4,701,342
DATED : October 20, 1987
INVENTOR(S) : Anthony E. Novembre, Elsa Reichmanis It is certified that error appears in the above-identified patent and that said Letters Patent is hereby corrected as shown below:

Column 2, line 50, that portion of the formula reading

Column 4, line 9, that portion of the formula reading

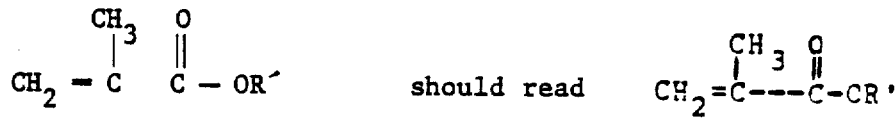

Column 8, line 37, that portion of the formula reading

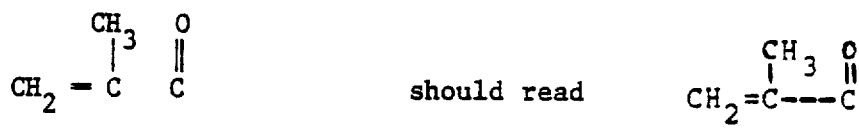

Signed and Sealed this

Seventh Day of March, 1989

*Attest:*

DONALD J. QUIGG

*Attesting Officer*    *Commissioner of Patents and Trademarks*